United States Patent
Koyama

(10) Patent No.: US 7,517,236 B2
(45) Date of Patent: Apr. 14, 2009

(54) THIN FILM TRANSISTOR CIRCUIT AND DISPLAY UTILIZING THE SAME

(75) Inventor: Jun Koyama, Kanagawa-ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 166 days.

(21) Appl. No.: 11/740,356

(22) Filed: Apr. 26, 2007

(65) Prior Publication Data

US 2007/0196959 A1    Aug. 23, 2007

Related U.S. Application Data

(63) Continuation of application No. 10/428,273, filed on May 2, 2003, now Pat. No. 7,211,961, and a continuation of application No. 09/328,713, filed on Jun. 9, 1999, now Pat. No. 6,563,270, and a continuation of application No. 08/998,984, filed on Dec. 29, 1997, now Pat. No. 5,942,856.

(30) Foreign Application Priority Data

Dec. 30, 1996    (JP)    ................................ 8-358952

(51) Int. Cl.
*H01L 21/82* (2006.01)
*H01L 21/00* (2006.01)
*H01L 21/84* (2006.01)

(52) U.S. Cl. ................. 439/129; 438/149; 438/151; 438/166

(58) Field of Classification Search ................. 438/129, 438/153, 149, 154, 164, 257, 381, 29–30, 438/57, 166, 283, 151, 128
See application file for complete search history.

(56) References Cited

U.S. PATENT DOCUMENTS

| | | | |
|---|---|---|---|
| 5,111,195 A | 5/1992 | Fukuoka |
| 5,250,835 A | 10/1993 | Izawa |
| 5,376,926 A | 12/1994 | Sano |
| 5,379,251 A | 1/1995 | Takeda |
| 5,383,041 A | 1/1995 | Yamazaki |
| 5,384,731 A | 1/1995 | Kuriyama |
| 5,455,534 A | 10/1995 | Motegi |
| 5,459,090 A | 10/1995 | Yamazaki |
| 5,526,303 A | 6/1996 | Okajima |
| 5,529,951 A | 6/1996 | Noguchi |
| 5,642,213 A | 6/1997 | Mase |
| 5,680,149 A | 10/1997 | Koyama |

(Continued)

FOREIGN PATENT DOCUMENTS

EP    0 610 927 A2    8/1994

(Continued)

*Primary Examiner*—Chuong Anh Luu
(74) *Attorney, Agent, or Firm*—Fish & Richardson P.C.

(57) ABSTRACT

There is provided a method of easily forming thin film transistors having the same characteristics in fabricating a differential circuit or a current mirror circuit utilizing two thin film transistors made of a polycrystalline silicon semiconductor. Four each thin film transistors are used in a differential circuit and a current mirror circuit, respectively. The thin film transistors are arranged to be symmetric to each other about a symmetry center instead of using thin film transistors arranged adjacently on the substrate in the respective circuits.

21 Claims, 7 Drawing Sheets

U.S. PATENT DOCUMENTS

| | | | |
|---|---|---|---|
| 5,693,959 A | 12/1997 | Inoue | |
| 5,712,496 A * | 1/1998 | Takahashi et al. | 257/64 |
| 5,729,308 A | 3/1998 | Yamazaki | |
| 5,731,613 A | 3/1998 | Yamazaki | |
| 5,763,899 A | 6/1998 | Yamazaki | |
| 5,771,110 A * | 6/1998 | Hirano et al. | 257/72 |
| 5,790,213 A | 8/1998 | Sasaki | |
| 5,814,539 A * | 9/1998 | Nakazawa | 438/163 |
| 5,843,797 A | 12/1998 | Iuchi | |
| 5,847,413 A | 12/1998 | Yamazaki | |
| 5,895,935 A | 4/1999 | Yamazaki | |
| 5,949,107 A | 9/1999 | Zhang | |
| 6,187,605 B1 * | 2/2001 | Takasu et al. | 438/29 |
| 6,417,896 B1 | 7/2002 | Yamazaki | |
| 6,914,642 B2 | 7/2005 | Yamazaki | |
| 2002/0149711 A1 | 10/2002 | Yamazaki | |
| 2005/0151146 A1 | 7/2005 | Lee | |

FOREIGN PATENT DOCUMENTS

| | | |
|---|---|---|
| JP | 05-199038 | 8/1993 |
| JP | 05-206815 | 8/1993 |
| JP | 05-235272 | 9/1993 |
| JP | 05-299611 | 11/1993 |
| JP | 06-053441 | 2/1994 |
| JP | 06-053442 | 2/1994 |
| JP | 06-295999 | 10/1994 |
| JP | 07-235844 | 9/1995 |
| JP | 07-288287 | 10/1995 |
| JP | 08-076088 | 3/1996 |
| JP | 08-160469 | 6/1996 |
| JP | 08-204521 | 8/1996 |
| JP | 09-102614 | 4/1997 |
| JP | 09-312260 | 12/1997 |

* cited by examiner

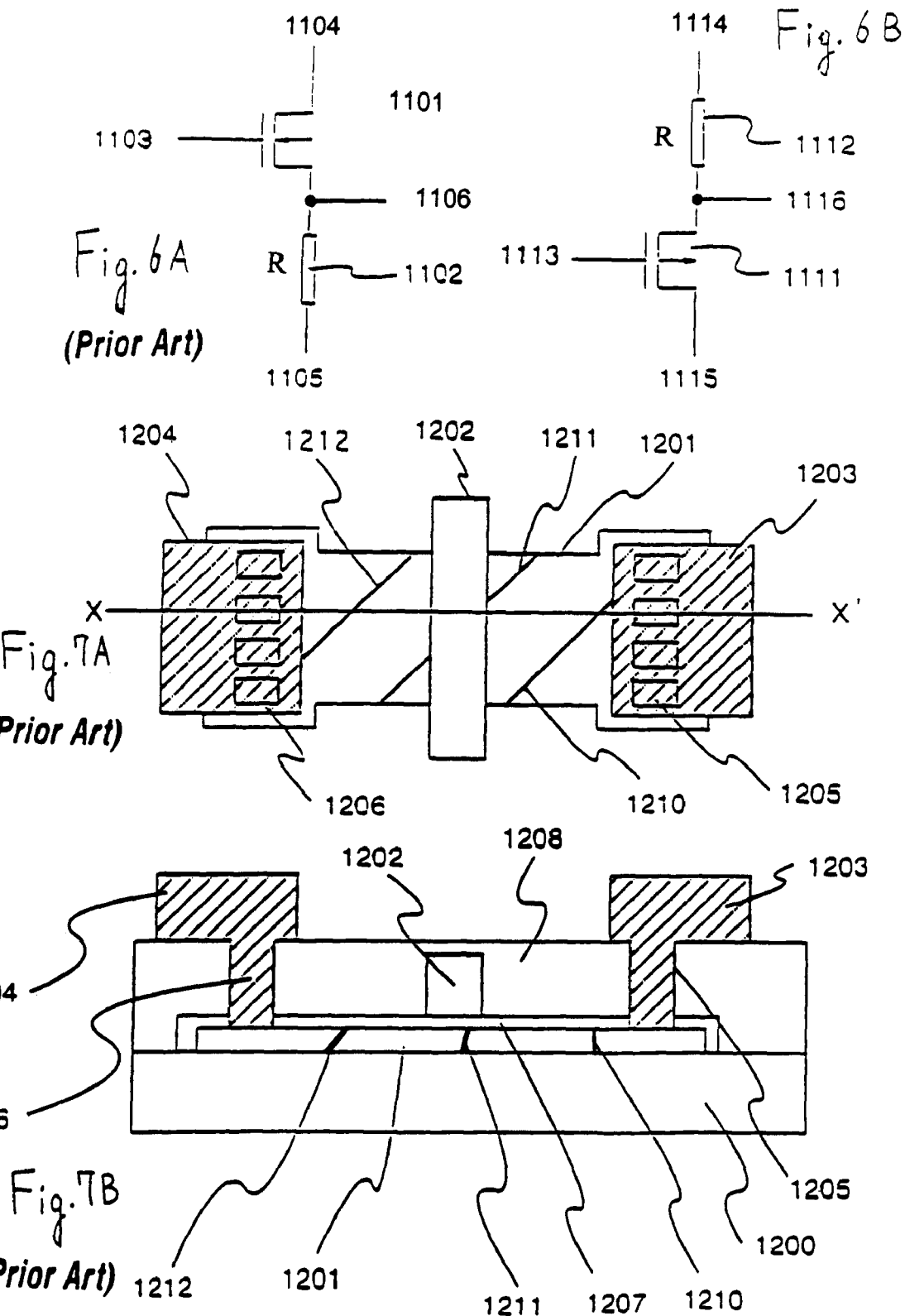

US 7,517,236 B2

THIN FILM TRANSISTOR CIRCUIT AND DISPLAY UTILIZING THE SAME

This application is a CON. of Ser. No. 10/428,273 filed on May 2, 2003, U.S. Pat. No. 7,211,961 and is a CON. of Ser. No. 09/328,713 filed on Jun. 9, 1999, U.S. Pat. No. 6,563,270 and CON. of Ser. No. 08/998,984 filed on Dec. 29, 1997, U.S. Pat. No. 5,942,856.

BACKGROUND OF THE INVENTION

1. Field of the Invention

The present invention relates to a differential amplifier circuit utilizing thin film transistors, a buffer amplifier utilizing the same and a displays such as liquid crystal displays and electro-luminescence display utilizing the same.

2. Description of the Prior Art

Conventional semiconductors used for liquid crystal displays utilizing thin film transistors include amorphous silicon, high temperature polysilicon formed using a maximum processing temperature of 1000° C. or the like and low temperature polysilicon formed using a maximum processing temperature of 600° C. or less.

Recently, there are displays which utilize medium temperature (temperatures between the high and low temperatures) polysilicon formed using a maximum processing temperature in the range from 600° C. to 1000° C. and displays which utilize a mixture of amorphous silicon and low temperature polysilicon.

FIG. 5A shows a liquid crystal display. Pixels 1001 are arranged in the form of a grid and are each connected to a data line 1005 and gate line 1004. A signal from a terminal 1021 such as a computer is converted by a D-A converter 1020 from a digital signal to an analog signal which is sent to a video signal line 1022. When the terminal 1021 is a television set which outputs an analog signal by itself, the D-A converter 1020 is not provided. The video signal line 1022 is connected to the source or drain of a switch transistor 1003 connected to each data line, and the switch transistor 1003 is opened when an open signal from a horizontal scan circuit 1010 is supplied to a switch gate line 1012 to supply a video signal to the data line 1005.

The video signal supplied to the data line 1005 is supplied through a buffer amplifier 1002 to the pixel 1001. The area of a pixel is shown in FIG. 5B. The data line 1005 is connected to the source or drain of the pixel switch transistor, and the source or drain which is not connected to the data line is connected to a liquid crystal 1050 and a storage capacity 1040.

The gate of the pixel transistor is connected to a gate line 1004 which is connected to a vertical scan circuit 1011.

The semiconductor used for this pixel transistor is any of amorphous silicon, low temperature polysilicon, medium temperature polysilicon, high temperature polysilicon and a mixture of amorphous silicon and low temperature polysilicon as described above.

Referring to a liquid crystal display utilizing amorphous silicon as a pixel transistor, amorphous silicon can not be used as a semiconductor for a buffer amplifier, switch transistor, horizontal scan circuit, vertical scan circuit or D-A converter because the field effect mobility of amorphous silicon is too small.

Therefore, the above-described circuits employ a monolithic IC utilizing a crystalline semiconductor such as single crystal silicon.

This results in a problem in that the surface area of regions on a liquid crystal display other than the display portion becomes large.

Further, cost reduction can not be achieved because of a high IC cost because a monolithic IC utilizing a crystalline semiconductor is used.

Under such circumstances, the use of polysilicon has been proposed. In the case of a liquid crystal display utilizing a low temperature polysilicon, medium temperature polysilicon, high temperature polysilicon or a mixture of amorphous silicon and low temperature polysilicon, since the field effect mobility of such a material is 10 to 100 times greater than that of amorphous silicon, it can be used as a semiconductor for the buffer amplifier, switch transistor, horizontal scan circuit and vertical scan circuit. A bipolar transistor or the like utilizing single crystal silicon semiconductor is required for a D-A converter which converts a digital signal into an analog signal in a very short period of time.

In the case of a liquid crystal display utilizing a low temperature polysilicon, medium temperature polysilicon, high temperature polysilicon or a mixture of amorphous silicon and low temperature polysilicon, since the pixel switches, buffer amplifier, switch transistors, horizontal scan circuit and vertical scan circuit can be formed on a substrate using polysilicon, it is possible to reduce the surface area of regions of the liquid crystal display other than the display portion.

There is another advantage in that cost reduction can be achieve in an amount corresponding to a reduction in the IC cost because no monolithic IC utilizing a crystalline semiconductor is used.

FIGS. 6A and 6B show conventional buffer amplifiers which can be formed using polysilicon. FIG. 6A shows a source follower formed using an n-channel type thin film transistor 1101 and a load resistor 1102, which is a buffer amplifier having a gain of substantially 1. 1103 designates an input terminal; 1106 designates an output terminal; 1104 designates a positive power source; and 1105 designates a positive power source.

FIG. 6B shows a source follower formed using a p-channel type thin film transistor 1111 and a load resistor 1112, which is a buffer amplifier having a gain of substantially 1. 1113 designates an input terminal; 1116 designates an output terminal; 1114 designates a positive power source; and 1115 designates a negative power source.

These buffer amplifier can be very simply formed because they are formed using only one transistor. However, since the transistors have great variation and greatly fluctuate in characteristics in response to temperature changes, they become inoperable as a buffer amplifier for an increased number of tones because such variation hides some tones, although they work properly for a liquid crystal display having a small number of display tones.

Referring to tones, when a liquid crystal display is driven by 5 V, the voltage width for one tone where there are eight tone in total is 5 V/8 that is 625 mv. The voltage width will be 313 mV, 156 mV, 78 mV, 39 mV and 20 mv where there are 16, 32, 64, 128 and 256 tones, respectively.

The number of tones that one transistor can provide is limited to the range from 16 to 32 tones because of changes in characteristics and variation from one transistor to another.

Further, even if a differential circuit is formed using two transistors, there is a problem inherent to polysilicon which has hindered variation in characteristics from being improved.

FIGS. 7A and 7B illustrate the problem inherent to polysilicon. FIG. 7A is a plan view of an insulated gate type polysilicon thin film transistor (hereinafter referred to as polysilicon thin film transistor) comprised of a gate electrode 1202, polysilicon 1201, a source electrode 1203, source contacts 1205, a drain electrode 1204 and drain contacts 1206. The polysilicon 1201 includes grain boundaries 1210, 1211 and 1212. The grain boundaries vary depending on the conditions under which the polysilicon has been crystallized, crystal nuclei, and their positions in the substrate rather than being formed uniformly.

FIG. 7B shows a sectional view taken along the line X-X' wherein the polysilicon 1201, the gate electrode 1202, a layer insulation film 1208, the source electrode 1203, the source contacts 1205, the drain electrode 1204 and the drain contacts 1206 are shown on a substrate 1200. The grain boundaries 1210, 1211 and 1212 are formed in the form of cuts into the section as illustrated.

Carriers flowing from the source to the drain traverse the grain boundaries.

The problem is not significant when there is only one polysilicon thin film transistor. However, when a buffer amplifier or the like is formed by a plurality of transistors, the characteristics of the individual transistors vary slightly because the grain boundaries in the individual transistors vary. This is unsuitable for use in thin film transistor circuits such as differential amplifier circuits wherein transistors should have the same characteristics, and it has been only possible to configure buffer amplifiers having 64 tones at most.

FIG. 9 shows crystallization utilizing a laser which is a method of forming low temperature polysilicon. FIG. 9 is a plan view of island-shaped semiconductors 1401, 1402, 1403, etc. provided on a substrate. The island-shaped semiconductors 1401, 1402, 1403, etc. are crystallized by a laser by irradiating areas 1410, 1411, 1412 and 1413 with the laser sequentially.

In the case of liquid crystal displays, the diagonal size of substrates is significantly greater than 1 inch and is normally 3 inches or more, and the diagonal size can be 8 inches or more where a multiplicity of liquid crystal displays are taken out from one substrate. Since it is thus impossible for a laser to irradiate the entire surface of a substrate to crystallize it at a time, laser irradiation areas are sequentially scanned as shown in FIG. 9 to crystallize the semiconductor on the entire surface of a substrate.

In this case, the laser irradiation areas may overlap each other, resulting in increased variation of crystallization of the semiconductor in such a region.

While an excimer laser is normally used, an excimer laser can not be normally used for fabricating polysilicon for thin film transistor circuits such as differential amplifier circuits wherein transistors must have the same characteristics because it realizes an excimer state using an inert gas such as argon or xenon and a halogen gas such as fluorine or chlorine to produce ultraviolet light having high energy and, as a result, there is variation of irradiation energy as great as 5% even in laser irradiation areas. Thus, it has been possible to configure only buffer amplifiers having 32 to 64 tones at most.

The method of fabricating polysilicon using a metal catalyst disclosed in Japanese unexamined patent publication No. H8-335152 associated with the patent application by the present applicant allows crystals to grown in the same direction. This process is shown in FIG. 8 which is a plan view of a polysilicon thin film transistor comprising a gate electrode 1302, polysilicon 1301, a source electrode 1303, source contacts 1305, a drain electrode 1304 and drain contacts 1306. The polysilicon 1301 includes acicular or columnar grains 1330. This is because there is a metal catalyst 1340 for promoting crystal growth which serves as crystal nuclei from which crystals grow. In a position symmetrical about the metal catalyst 1340, there is provided another polysilicon thin film transistor 1350 which includes acicular or columnar grains 1331.

Polysilicon thin film transistors formed according to this method have transistor characteristics much higher than those of polysilicon thin film transistors utilizing polysilicon crystallized by other processes such as crystallization wherein only heat is applied, laser crystallization and crystallization performed after forming a metal catalyst on the entire surface of a substrate. For example, while a drive signal has had a frequency on the order of only several MHz according to the prior art, the thin film transistors described above can be driven at frequencies of several tens MHz, several hundred MHz or more using a voltage in the range from 3.3 V to 5 V and can be operated at 1 GHz on the ring oscillator level and at 100 MHz on the shift register level.

However, even such thin film transistors having high characteristics formed utilizing a metal catalyst can not be currently used as they are for a differential amplifier circuit used as a buffer amplifier using two transistors to provide 256 tones, and they have been able to provide only 64 to 128 tones at most.

As described above, in a liquid crystal display incorporating a buffer amplifier using polysilicon thin film transistors, it has been difficult to form a buffer amplifier using a differential amplifier circuit having two transistors because the individual transistors have varied significantly depending on the method of fabrication used for the polysilicon.

In the case of thermally crystallized polysilicon, there is only provided buffer amplifiers having 64 tones at most because the grain boundaries are formed irregularly.

In the case of polysilicon crystallized using a laser, there is only provided buffer amplifiers having 32 to 64 tones at most depending on the degree of the overlapping of laser irradiation and instability of laser energy.

In the case of polysilicon utilizing a metal catalyst, there is provided buffer amplifiers having 128 tones at most.

According to the prior art, it has not been possible to fabricate a buffer amplifier constituted by a differential amplifier circuit utilizing a plurality of polysilicon thin film transistors formed from polysilicon materials produced according to different processes.

SUMMARY OF THE INVENTION

The present invention has been conceived taking the above-described problems into consideration and it is an object of the invention to provide a thin film transistor circuit such as a differential circuit utilizing thin film transistors formed by a combination of a plurality of transistors having the same characteristics, wherein individual transistors are arranged and fabricated such that a difference in characteristics between the individual transistors is reduced if any.

According to a first aspect of the invention, there is provided a thin film transistor circuit comprising:

at least a differential circuit including first through 2n-th ($n \geq 1$ where n is a natural number) thin film transistors having a common gate electrode potential to which a first input signal is input and (2n+1)-th through 2m-th ($m \geq n+1$ where m is a natural number) thin film transistors having a common gate electrode potential to which a second input signal is input, characterized in that:

channel formation regions of a j-th ($2n-1 \geq j \geq 1$ where j is a natural number) thin film transistor and a (j+1)-th thin film transistor among the first through 2n-th thin film transistors to which the first input signal is input are arranged to be point-symmetric on a plane;

channel formation regions of an i-th ($2m-1 \geq i \geq 2n$ where i is a natural number) thin film transistor and an (i+1)-th thin film transistor among the (2n+1)-th through 2m-th thin film transistors to which the second input signal is input are arranged to be point-symmetric on a plane; and the symmetry centers of the channel formation regions of the first through 2n-th thin film transistors and the symmetry centers of the channel formation regions of the (2n+1)-th through 2m-th thin film transistors are the same points.

According to a second aspect of the invention, there is provided a thin film transistor circuit comprising:

a current mirror circuit which includes at least first through 2n-th($n \geq 1$ where n is a natural number) thin film transistors having a common gate electrode potential and (2n+1)-th through 2m-th($m \geq n+1$ where m is a natural number) thin film transistors having a common gate electrode potential and in which the gate electrodes of the first through 2n-th thin film transistors or the (2n+1)-th through 2m-th thin film transistors are connected to the sources or drains, characterized in that:

channel formation regions of a j-th ($2n-1 \geq j \geq 1$ where j is a natural number) thin film transistor and a (j+1)-th thin film transistor among the first through 2n-th thin film transistors to which the first input signal is input are arranged to be point-symmetric on a plane;

channel formation regions of an i-th ($2m-1 \geq i \geq 2n$ where i is a natural number) thin film transistor and an (i+1)-th thin film transistor among the (2n+1)-th through 2m-th thin film transistors to which the second input signal is input are arranged to be point-symmetric on a plane; and the symmetry centers of the channel formation regions of the first through 2n-th thin film transistors and the symmetry centers of the channel formation regions of the (2n+1)-th through 2m-th thin film transistors are the same points.

According to a third aspect of the invention, there is provided a thin film transistor circuit comprising:

a differential circuit including at least first through 2k-th ($k \geq 1$ where k is a natural number) thin film transistors having a common gate electrode potential to which a first input signal is input and (2k+1)-th through 2l-th ($1 \geq k+1$ where l is a natural number) thin film transistors having a common gate electrode potential to which a second input signal is input and comprising a current mirror circuit which includes at least first through 2n-th ($n \geq 1$ where n is a natural number) thin film transistors and (2n+1)-th through 2m-th ($m \geq n+1$ where m is a natural number) thin film transistors having a common gate electrode potential and in which the gate electrodes of the first through 2n-th thin film transistors or the (2n+1)-th through 2m-th thin film transistors are connected to the sources or drains, wherein:

the source-drain polarity of the thin film transistors in the differential circuit and the source-drain polarity of the thin film transistors in the current mirror circuit are opposite to each other and the sources or drains of the first through 2k-th thin film transistors of the differential circuit are connected to the sources or drains of the first through 2n-th thin film transistors of the current mirror circuit;

the sources or drains of the (2k+1)-th through 2l-th thin film transistors of the differential circuit are connected to the sources or drains of the (2n+1)-th through 2m-th thin film transistors of the current mirror circuit;

the sources or drains of the first through 2k-th thin film transistors of the differential circuit which are not connected to the current mirror circuit are connected to the sources or drains of the (2k+1)-th through 2l-th thin film transistors; and an output signal is taken out from a portion of the current mirror circuit connected to the differential circuit where the gate electrodes of either first through 2n-th thin film transistors or (2n+1)-th through 2m-th thin film transistors are not connected to the source or drains;

channel formation regions of a g-th ($2k-1 \geq g \geq 1$ where g is a natural number) thin film and a (g+1)-th thin film transistor among the first through 2k-th thin film transistors of the differential circuit to which the first input signal is input are arranged to be point-symmetric on a plane;

channel formation regions of an h-th ($2l-1 \geq h \geq 2k$ where h is a natural number) thin film transistor and an (h+1)-th thin film transistor among the (2k+1)-th through 2l-th thin film transistors to which the second input signal is input are arranged to be point-symmetric on a plane;

the symmetry centers of the channel formation regions of the first through 2n-th thin film transistors and the symmetry centers of the channel formation regions of the (2n+1)-th through 2m-th thin film transistors are the same points;

channel formation regions of a j-th ($2n-1 \geq j \geq 1$ where j is a natural number) thin film transistor and a (j+1)-th thin film transistor among the first through 2n-th thin film transistors are arranged to be point-symmetric on a plane;

channel formation regions of an i-th ($2m-1 \geq i \geq 2n$ where i is a natural number) thin film transistor and an (i+1)-th thin film transistor among the (2n+1)-th through 2m-th thin film transistors of the current mirror circuit are arranged to be point-symmetric on a plane; and the symmetry centers of the channel formation regions of the first through 2n-th thin film transistors and the symmetry centers of the channel formation regions of the (2n+1)-th through 2m-th thin film transistors are the same points.

According to a fourth aspect of the invention, there is provided a thin film transistor circuit according to any of the first through third aspects, wherein the source and drain regions of the thin film transistors are made of polycrystalline silicon.

According to a fifth aspect of the invention, there is provided a thin film transistor circuit according to any of the first through fourth aspects, wherein the channel formation regions of the thin film transistors are made of polycrystalline silicon comprising acicular crystals.

According to a sixth aspect of the invention, there is provided a thin film transistor circuit according to any of the first through fifth aspects, wherein the channel formation regions of the thin film transistors are made of polycrystalline silicon crystallized using a metal catalyst.

According to a seventh aspect of the invention, there is provided a thin film transistor circuit according to any of the first through sixth aspects, wherein the channel formation regions of the thin film transistors are made of polycrystalline silicon crystallized using a laser.

According to an eighth aspect of the invention, there is provided a thin film transistor circuit according to any of the first through seventh aspects, wherein the channel formation regions of the thin film transistors are made of polycrystalline silicon crystallized including grain boundaries.

According to a ninth aspect of the invention, there is provided a thin film transistor circuit according to any of the first through eighth aspects, wherein the source and drain regions of the thin film transistors are made of polycrystalline silicon crystallized using a laser.

According to a tenth aspect of the invention, there is provided a thin film transistor circuit according third aspect, wherein:

a power source voltage is supplied to the sources or drains of the first through 2n-th thin film transistors of the current mirror circuit which are not connected to the sources or drains of the first through 2k-th thin film transistors of the differential amplifier;

the power source voltage is supplied to the sources or drains of the (2n+1)-th through 2m-th thin film transistors of the current mirror circuit which are not connected to the sources or drains of the (2k+1)-th through 2l-th thin film transistors of the differential amplifier circuit; and the sources or drains of the first through 2k-th thin film transistors which are not connected to the current mirror circuit are connected to the sources or drains of the (2k+1)-th through 2l-th thin film transistors and to a constant current source.

According to an eleventh aspect of the invention, there is provided a thin film transistor circuit according to the third or tenth aspect, characterized in that an analog signal is input as the first input signal and the output signal is connected to the second input signal to form a buffer amplifier.

According to a twelfth aspect of the invention, there is provided an active matrix type liquid crystal display comprising at least pixel electrodes, pixel switches connected to the pixel electrodes, a horizontal scan circuit and a vertical scan circuit provided on an insulated substrate, characterized in that a buffer amplifier or differential amplifier circuit for outputting an analog input signal as an analog output signal is provided between the horizontal scan circuit and the pixel switches and in that the buffer amplifier or differential circuit includes thin film transistors according to any one of the first through eleventh aspects.

According to a thirteenth aspect of the invention, there is provided a display according to the twelfth aspect, characterized in that the analog input signal is an analog signal which has been subjected to digital-to-analog conversion at the preceding stage.

BRIEF DESCRIPTION OF THE DRAWINGS

FIG. 6A is a schematic of a circuit according to the prior art.

FIG. 6B is a schematic of a circuit according to the prior art.

FIGS. 7A and 7B are views of elements according to the prior art.

DETAILED DESCRIPTION OF PREFERRED EMBODIMENTS

Figure 1A:
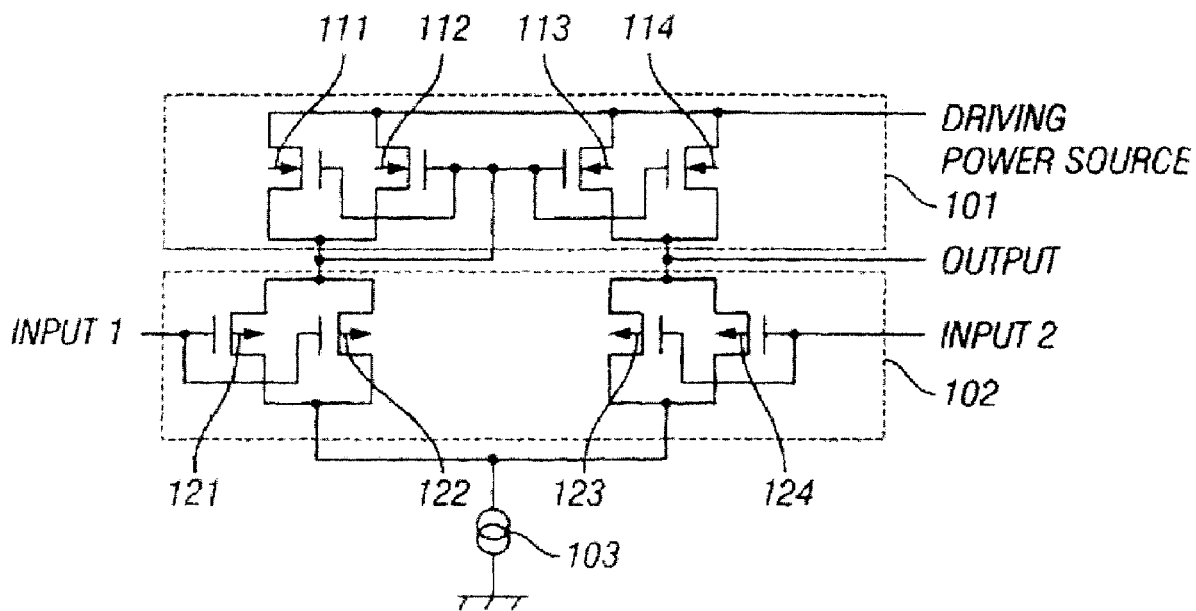
FIG. 1A is a schematic of a circuit according to the present invention.

The present invention will now be described with reference to FIGS. 1A and 1B. FIG. 1A shows an example of a circuit configuration of thin film transistors according to the present invention. The areas enclosed by the dotted line constitute a current mirror circuit 101 and a differential circuit 102. The current mirror circuit is connected to a driving power source, and the differential circuit 102 includes an input 1 and an input 2 for inputting input signals. The differential circuit 102 is connected to a constant current source 103.

When a signal is input to each of the inputs 1 and 2 of the circuit, a difference between them is output from an output as an output signal. When a new output is taken out from a connected portion (not shown) between the output and the input 2, the circuit operates as an analog buffer amplifier which outputs the same signal as the input signal input at the input 1.

Each of the current mirror circuit 101 and differential circuit 102 includes four thin film transistors as constituent parts. The thin film transistors used in the current mirror circuit 101 and differential circuit 102 have opposite polarities. In FIGS. 1A and 1B, n-type thin film transistors are used in the current mirror circuit 101 and p-type thin film transistors are used in the differential circuit 102. The p-type and n-type polarities may be reversed.

This circuit does not operate when they have the same polarity.

N-type thin film transistors (hereinafter referred to as n-TFTs) 111, 112, 113 and 114 are provided in the current mirror circuit 101. A first set of n-TFTs 111 and 112 are paired, and a second set of n-TFTs 113 and 114 are paired. The gate electrodes of the first set of n-TFTs 111 and 112 are connected to each other; the gate electrodes of the second set of n-TFTs 113 and 114 are connected to each other; and the gate electrodes of those sets are connected. The connected portion is connected to the sources or drains of the n-TFTs 111 and 112. The drains or sources of the n-TFTs 111, 112, 113 and 114 which are not connected to the gate electrodes are connected to a driving power source.

The current mirror circuit 101 inherently operates as a circuit even if there is one each thin film transistor in place of the first and second sets. In practice, in the case of a single crystal monolithic semiconductor for which variation is almost negligible, each of the first and second sets comprises one transistor.

In order to carry out the present invention, however, a plurality of thin transistors are required for each set and therefore the first and second sets comprise two each thin film transistors.

The differential circuit 102 includes p-type thin film transistors (hereinafter referred to as p-TFTs) 121, 122, 123 and 124. A first set of p-TFTs 121 and 122 are paired, and a second set of p-TFTs 123 and 124 are paired. The gate electrodes of the first set of p-TFTs 121 and 122 are connected to each other and are connected to a first input signal source, and the gate electrodes of the second set of p-TFTs 123 and 124 are connected to each other and are connected to a second input signal source. The sources and drains of the p-TFTs 121, 122, 123 and 124 are connected to a constant current power source 103.

The differential circuit 102 inherently operates as a circuit even if there is one each thin film transistor in place of the first and second sets. In practice, in the case of a single crystal monolithic semiconductor for which variation is almost negligible, each of the first and second sets comprises one transistor.

In order to carry out the present invention, however, a plurality of thin transistors are required for each set and therefore the first and second sets comprise two each thin film transistors.

The sources or drains of the first set of n-TFTs 111 and 112 of the current mirror circuit 101 are connected to the drains or sources of the first set of p-TFTs 121 and 122 of the differential circuit 102, and the sources or drains of the second set of n-TFTs 113 and 114 of the current mirror circuit 101 are connected to the drains or sources of the second set of p-TFTs 123 and 124 of the differential circuit 102. An output signal is taken out from the portion where the second sets of n-TFTs 113 and 114 and p-TFTs 123 and 124 are connected.

It is most important for the operation of the current mirror circuit 101 and differential circuit 102 that the characteristics of the first and second sets of thin film transistors are as close to each other as possible. Especially, the field effect mobility and the characteristics of the threshold voltages Vth of those transistors must be as close to each other as possible.

For example, when they are used as a buffer amplifier of a liquid crystal display which is driven by 5 V, the voltage width for one tone where there are eight tone in total is 5 V/8 that is 625 mV. The voltage width will be 313 mV, 156 mV, 78 mV, 39 mV and 20 mV where there are 16, 32, 64, 128 and 256 tones, respectively.

Therefore, the widths of deviations between thin film transistors in the threshold value and field effect mobility determine the number of tones that can be displayed using them. The present invention reduces such widths of deviation.

For simplicity of description, the differential circuit 102 will be first described.

On the assumption that a certain degree of variation of individual transistors is inevitable as mentioned in the description of the prior art, the inventor has found that such variation can be reduced by combining transistors properly.

Specifically, when two thin film transistors are picked up and compared to each other, their characteristics may be substantially the same or may significantly different. However, comparison between a certain group of thin film transistors and another group of thin film transistors does not result in a significant difference when those groups are compared in terms of average values and the difference in the average values of characteristics can be reduced further depending on the way in which such groups are formed.

As described in the section of the description of the prior art, a major cause of variation in characteristics between individual thin film transistors is the positions of the thin film transistors on the substrate, which is true especially in cases where polycrystalline silicon semiconductor is used.

In order to reduce such a difference in characteristics between the first set of thin film transistors p-TFTs 121 and 122 and the second set of thin film transistors p-TFTs 123 and 124, each set is formed by two transistors to level off variation that will be significant if there is only one transistor. Such leveling is carried out by forming two transistors in positions that are geometrically point-symmetric about a symmetry center into one set of transistors and selecting other two transistors in positions that are point-symmetric into another set of transistors instead of pairing adjoining transistors.

Figure 1B:
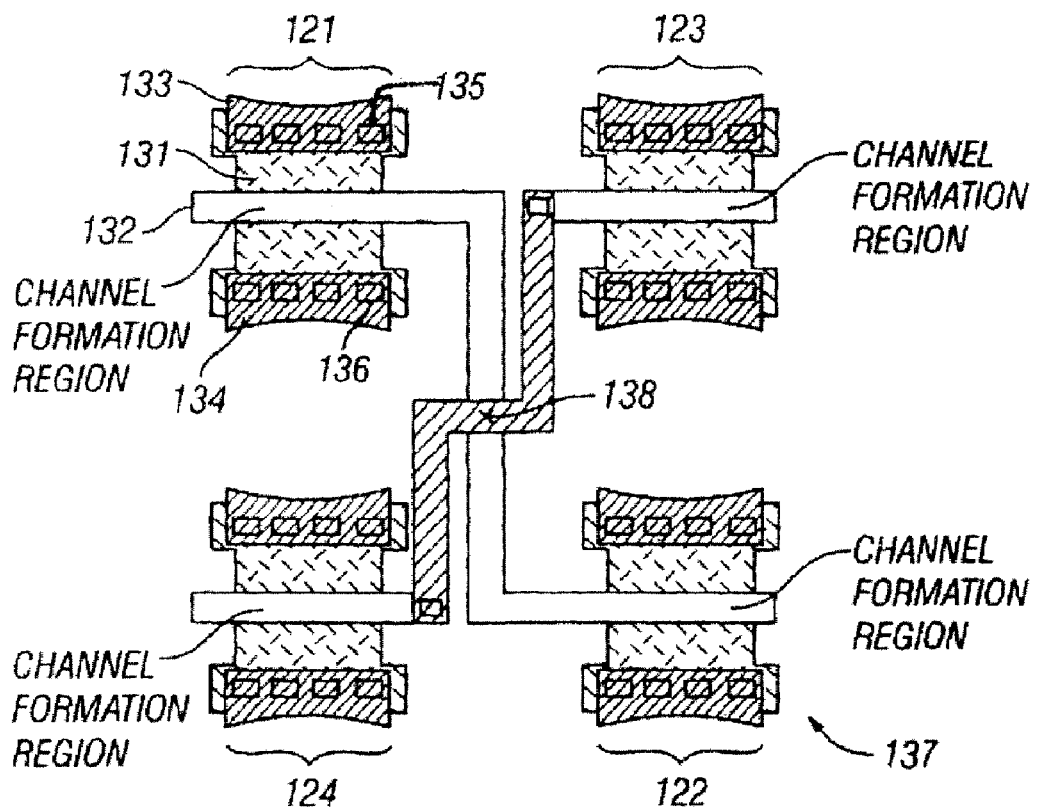
FIG. 1B is a plan view of the circuit according to the present invention.

FIG. 1B shows an example of a horizontal arrangement and connection of four thin film transistors of the differential circuit 102 on the substrate. As illustrated, the p-TFTs 121 and 122 are in diagonal positions and the p-TFTs 123 and 124 are in opposite diagonal positions to be in a crossing relationship with the p-TFTs 121 and 122. Each set of TFTs is in a positional relationship which is point-symmetric about a symmetry center 138, and each thin film transistor has the same basic configuration.

There are semiconductor layer 131, a source electrode 133, source contacts 135, a drain electrode 134, drain contacts 136, and a gate electrode 132. Although not shown in FIG. 1B which is a plan view, a gate insulation film is provided under the gate electrode 132, and the semiconductor 131 is provided under the gate insulation film. There is a channel formation region in the area of the semiconductor layer 131 overlapping with the gate electrode 132.

The p-TFTs 121 and 122 share a common gate electrode 132, and the p-TFTs 123 and 124 share a common gate electrode 137. Although the connections of the sources and drains are not shown, the active regions of the thin film transistors are almost entirely constituted by the channel formation regions and variation of carriers that flow through the channel formation regions is entirely attributable to variation between the thin film transistors. The connections of the source electrodes and drain electrodes have almost nothing to do with variation of the thin film transistors.

Therefore, when transistors are placed in positions which are point-symmetric about the symmetry center 138, it is important to place the channel formation regions in the point-symmetric positions instead of placing the transistors as a whole in the point-symmetric positions.

Although FIGS. 1A and 1B show an example where four each thin film transistors are used in the current mirror circuit 101 and differential circuit 102, the number of the transistors may be increased to reduce variation of characteristics further. Obviously, liquid crystal displays having 64 tones and 256 tones have different requirements for variation, and variation must be smaller for 256 tones.

Figure 2:
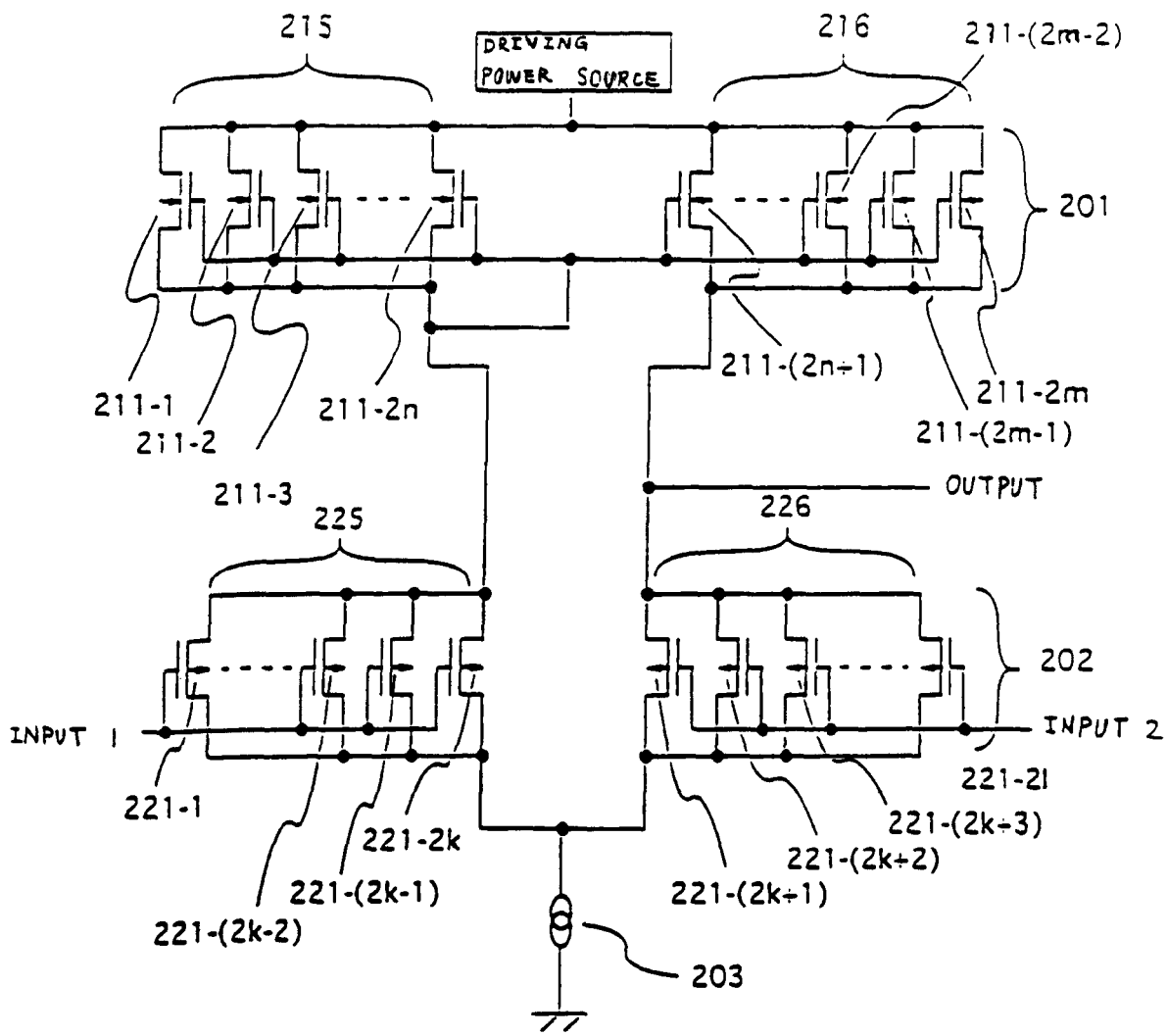
FIG. 2 is a schematic of a circuit according to the present invention.

FIG. 2 shows an example of use of a plurality of transistors in order to level off variation in characteristics of individual thin film transistors.

The present invention will be described with reference to FIG. 2 wherein current mirror circuit 201 and a differential circuit 202 are configured; the current mirror circuit 201 is connected to a driving power source; and the differential circuit 202 have an input 1 and an input 2 to which input signals are input. The differential circuit 202 is connected to a constant current source 203.

An output signal is output between the current mirror circuit 201 and differential circuit 202.

When a signal is input to each of the inputs 1 and 2 of this circuit, a difference between them is output from an output as an output signal. When a new output is taken out from a connected portion (not shown) between the output and the input 2, the circuit operates as an analog buffer amplifier which outputs the same signal as the input signal input at the input 1.

The current mirror circuit 201 includes 2m thin film transistors 211-1 through 211-2m and the differential circuit 202 includes 2l thin film transistors 221-1 through 221-2l as constituent parts. The thin film transistors used in the current mirror circuit 201 and differential circuit 202 have opposite polarities. In FIG. 2, n-type thin film transistors are used in the current mirror circuit 201 and p-type thin film transistors are used in the differential circuit 202. The p-type and n-type polarities may be reversed.

This circuit does not operate when they have the same polarity.

In the current mirror circuit 201, a first set of transistors 215 is formed by 2n pieces of n-type thin film transistors (hereinafter referred to as n-TFTs) 211-1 through 211-2n. A second set of transistors 216 is formed by 2m-2n pieces of n-TFTs 211-(2n+1) through 211-2m. The gate electrodes of the first set 215 of n-TFTs are connected to each other; the gate electrodes of the second set 216 of n-TFTs are connected to each other; and the gate electrodes of those sets are connected. The connected portion is connected to the sources or drains of either of those sets. The drains or sources on the other side are connected to the corresponding drains or sources of the other sets or to a driving power source.

In the differential circuit 202, a first set of transistors 225 is formed by 2k pieces of p-type thin film transistors (hereinafter referred to as p-TFTs) 221-1 through 221-2k. A second set of transistors 226 is formed by 2l-2k pieces of p-TFTs 221-(2k+1) through 221-2l. The gate electrodes of the first set 225 of p-TFTs are connected to a first input signal source, and the gate electrodes of the second set 226 of p-TFTs are connected to a second input signal source. The sources or drains of all p-TFTs in the first set 225 and second set 226 are connected to the constant current power source 203.

The sources or drains of the first set 215 of n-TFTs of the current mirror circuit 201 are connected to the drains or sources of the first set 225 of p-TFTs of the differential circuit 202, and the sources or drains of the second set 216 of n-TFTs of the current mirror circuit 201 are connected to the drains or sources of the second set 226 of p-TFTs of the differential circuit 202. An output signal is taken out from the position where the second n-TFTs and p-TFTs are connected.

For simplicity of description, only the current mirror circuit 201 will be described. In order to reduce any difference in characteristics between the first set of thin film transistors 215 and the second set of thin film transistors 216, the first set 215 is formed by 2n pieces of n-TFTs and the second set 216 is formed by 2m-2n pieces of n-TFTs to level off variation that will be significant if there is only one transistor. Such leveling is carried out by forming two transistors in positions that are geometrically point-symmetric about a symmetry center into one set of transistors and selecting other two transistors in positions that are point-symmetric into another set of transistors instead of combining adjoining transistors.

Therefore, both of the first set 215 and second set 216 must have an even number of n-TFTs.

The active regions of the thin film transistors are almost entirely constituted by the channel formation regions, and variation of carriers that flow through the channel formation regions is entirely attributable to variation between the thin film transistors. The connections of the source electrodes and drain electrodes have almost nothing to do with variation of the thin film transistors.

When the transistors are placed in positions which are point-symmetric about the symmetry center, it is important to place the channel formation regions in the point-symmetric positions instead of placing the transistors as a whole in the point-symmetric positions.

The above-description on the current mirror circuit 201 equally applies to the differential circuit 202. FIG. 2 corresponds to the example shown in FIG. 1 when n=1, m=2, k=1 and l=2. Obviously, liquid crystal displays having 64 tones and 256 tones have different requirements for variation, and variation must be smaller for 256 tones. Therefore, the values n, m, k and l may be determined depending on required specifications.

A first embodiment of the present invention will now be described.

Figure 3A:
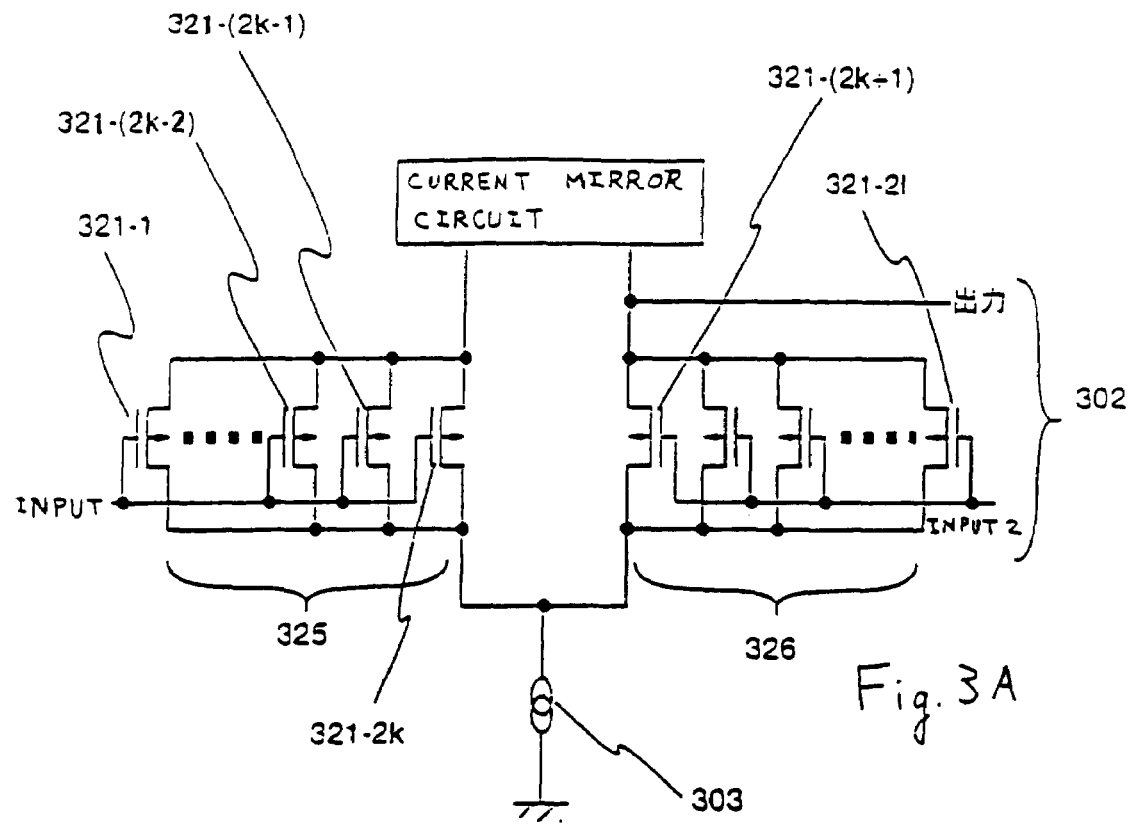
FIGS. 3A and 3B are schematics of circuits according to the present invention.
Figure 3B:
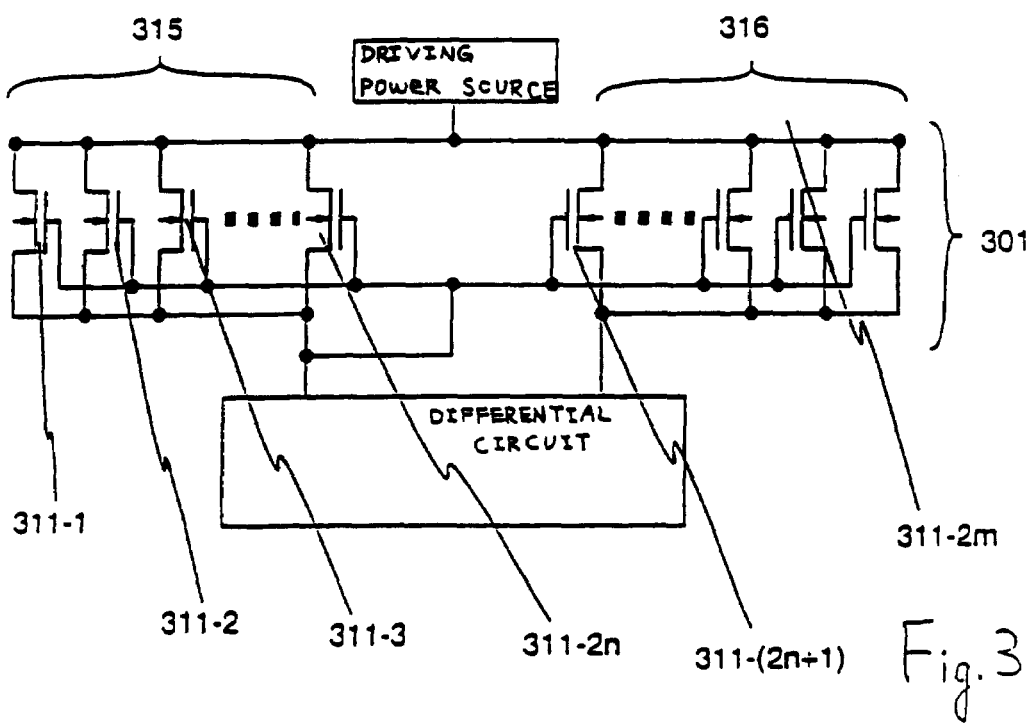

FIGS. 3A and 3B show the present embodiment. FIG. 3A shows an example wherein the present invention is applied to the differential circuit 302. An example is shown wherein the present invention is applied only to the differential circuit 302 when the differential circuit is connected to the current mirror circuit and it is known that the thin film transistors in the differential circuit 302 are likely to vary in characteristics depending on the process used for the thin film semiconductor and the arrangement of the thin film transistors.

For example, this can occur during formation of the multiplicity of thin film semiconductors on a substrate when the position on the substrate where the differential amplifier circuit is to be formed is at the periphery of the substrate and especially when the differential circuit 302 is positioned close to the periphery of the substrate to increase variation of the characteristics of individual thin film transistors thereof. When a semiconductor layer including channel formation regions of thin film transistors is formed using a parallel plate plasma enhanced CVD system, the electric field of the electrodes is weak and the flow of a reaction gas is disturbed most severely at the periphery of the substrate. For this reason, active semiconductor elements are not normally formed in the range of about 10 mm from the periphery of a substrate.

However, when the differential circuit 302 is formed using thin film transistors which are in the vicinity of the periphery of the substrate, variation in the characteristics of the transistors can be a serious problem even if they are 10 mm apart from the substrate periphery.

In the differential circuit 302, a first set of thin film transistors 325 and a second set of thin film transistors 326 face each other. The first set of thin film transistors 325 comprises 2k pieces of thin film transistors 321-1 through 321-2k, and the gate, source and drain electrodes of each of the 2k pieces of transistors are connected. There is provided a first input terminal for inputting an input signal to the connected gate electrodes; the connected source or drain electrodes are connected to the current mirror circuit; and the other drain or source electrodes are connected to a constant current power source.

The second set of thin film transistors 326 comprises 2l-2k pieces of thin film transistors 322-(2k+1) through 321-2l, and the gate, source and drain electrodes of each of the 2l-2k pieces of transistors are connected. There is provided a second input terminal for inputting an input signal to the connected gate electrodes; the connected source or drain electrodes are connected to the current mirror circuit; and the other drain or source electrodes are connected to a constant current power source.

In order to reduce any difference in characteristics between the first set of thin film transistors 325 and the second set of thin film transistors 326, the first set 325 is formed by 2k pieces of thin film transistors and the second set 326 is formed by 2l-2k pieces of thin film transistors to level off variation that will be significant if there is only one transistor. Such leveling is carried out by forming two transistors in positions that are geometrically point-symmetric about a symmetry center into one set of transistors and selecting other two transistors in positions that are point-symmetric into another set of transistors instead of combining adjoining transistors.

Therefore, both of the first set 325 and second set 326 must have an even number of thin film transistors.

The active regions of the thin film transistors are almost entirely constituted by the channel formation regions, and variation of carriers that flow through the channel formation regions is entirely attributable to variation between the thin film transistors. The connections of the source electrodes and drain electrodes have almost nothing to do with variation of the thin film transistors.

When the transistors are placed in positions which are point-symmetric about the symmetry center, it is important to place the channel formation regions in the point-symmetric positions instead of placing the transistors as a whole in the point-symmetric positions.

Although all of the thin film transistors shown in FIG. 3A are of p-type, the above description equally applies where they are all n-type transistors.

FIG. 3B shows an example wherein the present invention is applied to the current mirror circuit 301. An example is shown wherein the present invention is applied only to the current mirror circuit 301 when the current mirror circuit is connected to the differential circuit and it is known that the thin film transistors in the current mirror circuit 301 are likely to vary in characteristics depending on the process used for the thin film semiconductor and the arrangement of the thin film transistors.

For example, this can occur during formation of the multiplicity of thin film semiconductors on a substrate when the position on the substrate where the differential amplifier circuit is to be formed is at the periphery of the substrate and especially when the current mirror circuit 301 is positioned close to the periphery of the substrate to increase variation of the characteristics of individual thin film transistors thereof. When a semiconductor layer including channel formation regions of thin film transistors is formed using a parallel plate plasma enhanced CVD system, the electric field of the electrodes is weak and the flow of a reaction gas is disturbed most severely at the periphery of the substrate. For this reason, active semiconductor elements are not normally formed in the range of about 10 mm from the periphery of a substrate.

However, when the current mirror circuit 301 is formed using thin film transistors which are in the vicinity of the periphery of a substrate, variation in the characteristics of the transistors can be a serious problem even if they are 10 mm apart from the substrate periphery.

In the current mirror circuit 301, a first set of thin film transistors 315 and a second set of thin film transistors 316 face each other. The first set of thin film transistors 315 comprises 2n pieces of thin film transistors 311-1 through 311-2*n*, and the gate, source and drain electrodes of each of the 2n pieces of transistors are connected. The connected source or drain electrodes are connected to the differential amplifier circuit, and the other drain or source electrodes are connected to a driving power source.

The second set of thin film transistors 316 comprises 2m-2n pieces of thin film transistors 311-(2n+1) through 311-2*m*, and the gate, source and drain electrodes of each of the 2m-2n pieces of transistors are connected. The connected source or drain electrodes are connected to the differential amplifier circuit, and the other drain or source electrodes are connected to a constant current power source. The gate electrodes of the first sets of thin film transistors 315 thus connected are connected to the gate electrodes of the second set of thin film transistors 316 thus connected. The gate electrodes thus connected are connected to the source or drain electrodes of the first set of thin film transistors 315 which are connected to the differential circuit.

In order to reduce any difference in characteristics between the first set of thin film transistors 315 and the second set of thin film transistors 316, the first set 315 is formed by 2n pieces of thin film transistors and the second set 316 is formed by 2m-2n pieces of thin film transistors to level off variation that will be significant if there is only one transistor. Such leveling is carried out by forming two transistors in positions that are geometrically point-symmetric about a symmetry center into one set of transistors and selecting other two transistors in positions that are point-symmetric into another set of transistors instead of combining adjoining transistors.

Therefore, both of the first set 315 and second set 316 must have an even number of thin film transistors.

The active regions of the thin film transistors are almost entirely constituted by the channel formation regions, and variation of carriers that flow through the channel formation regions is entirely attributable to variation between the thin film transistors. The connections of the source electrodes and drain electrodes have almost nothing to do with variation of the thin film transistors.

When the transistors are placed in positions which are point-symmetric about the symmetry center, it is important to place the channel formation regions in the point-symmetric positions instead of placing the transistors as a whole in the point-symmetric positions.

Although all of the thin film transistors shown in FIG. 3B are of n-type, the above description equally applies where they are all p-type transistors.

When a liquid crystal display for a liquid crystal projector having a diagonal dimension of 3 inches (76 mm) as shown in FIGS. 3A and 3B was formed using a manufacturing step utilizing high temperature silicon for forming six liquid crystal displays of 3 inches from one sheet of quartz substrate or synthesized quarts substrate, a circuit located at the periphery of the substrate displayed 64 tones when used for display of 64 tones for which a buffer amplifier is required.

Without the configuration according to the invention, although values on the order of 64 tones can be achieved in some regions such as the center of a substrate if processing conditions are sufficiently examined, it has not been possible to display 64 tones at the periphery of a substrate.

Obviously, it is preferable that the configuration of the present embodiment is applied to the entire region of a substrate instead of applying it to only the periphery of the substrate from the viewpoint of problems associated with fabrication processes that originates in uniformity of the circuit patterns or variation of the pattern depending on its position on the substrate. Especially, the present invention is preferably applied to cases wherein channel formation regions include grain boundaries.

Figure 9:
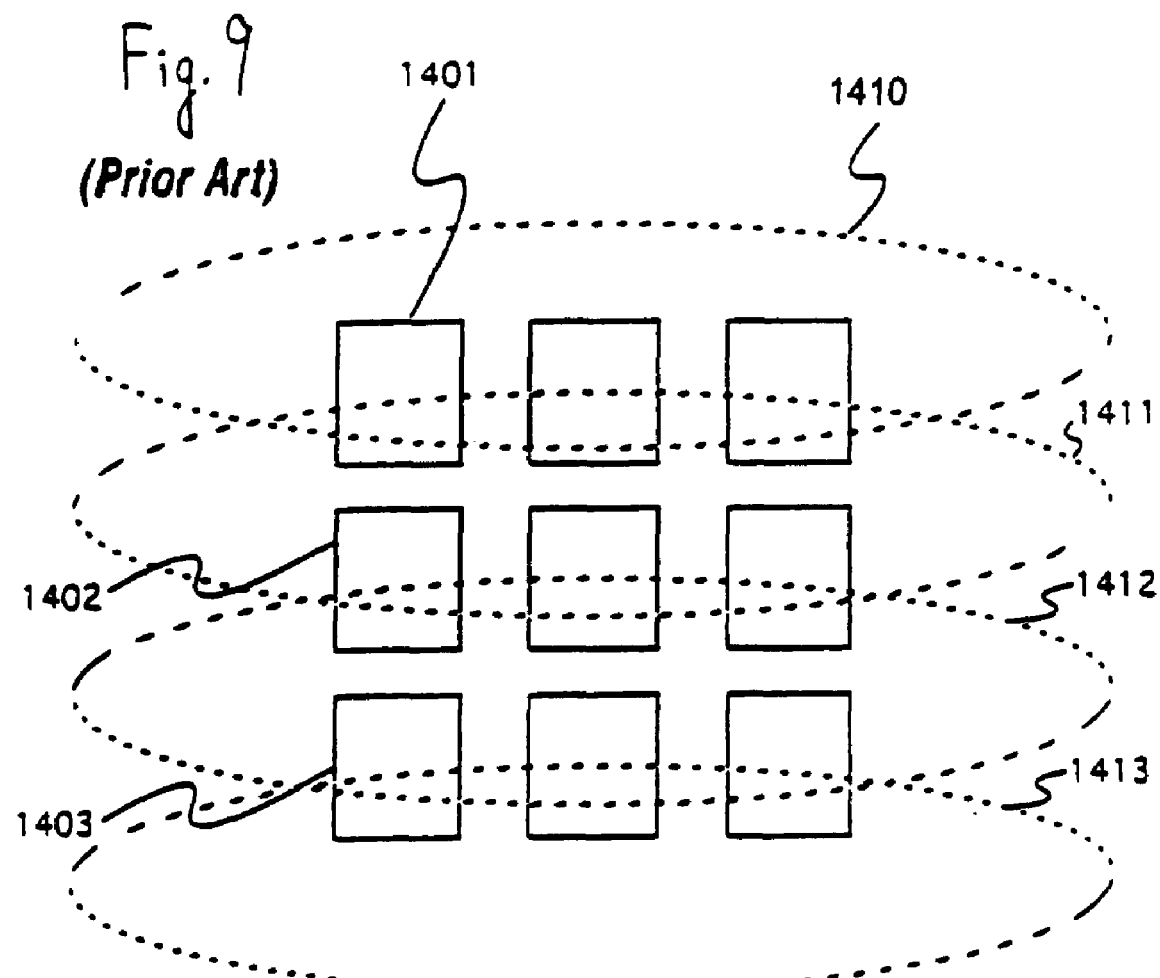
FIG. 9 shows manufacturing steps according to the prior art.

Further, when polysilicon obtained using laser crystallization or when both of polysilicon and amorphous silicon are used, as shown in FIG. 9, the present embodiment may be advantageously used in a position where there is no way to achieve uniformity of thin film polysilicon transistors because of the position of the laser irradiation. It is obvious that the present embodiment may be applied to not only combination of thin film transistors in a position on a substrate defined by the laser irradiating position but also to any position on the entire surface of the substrate.

The present embodiment is advantageous especially for acicular or columnar polycrystalline silicon thin film transistors that have grown in lateral directions according to the method of crystallization utilizing a metal catalyst described in Japanese unexamined patent publication No. H8-335152 of the present applicant. In this case, 128 tones can be obviously displayed on the entire area of the substrate and even 256 tones can be displayed.

A second embodiment of the present invention will now be described.

Figure 4:
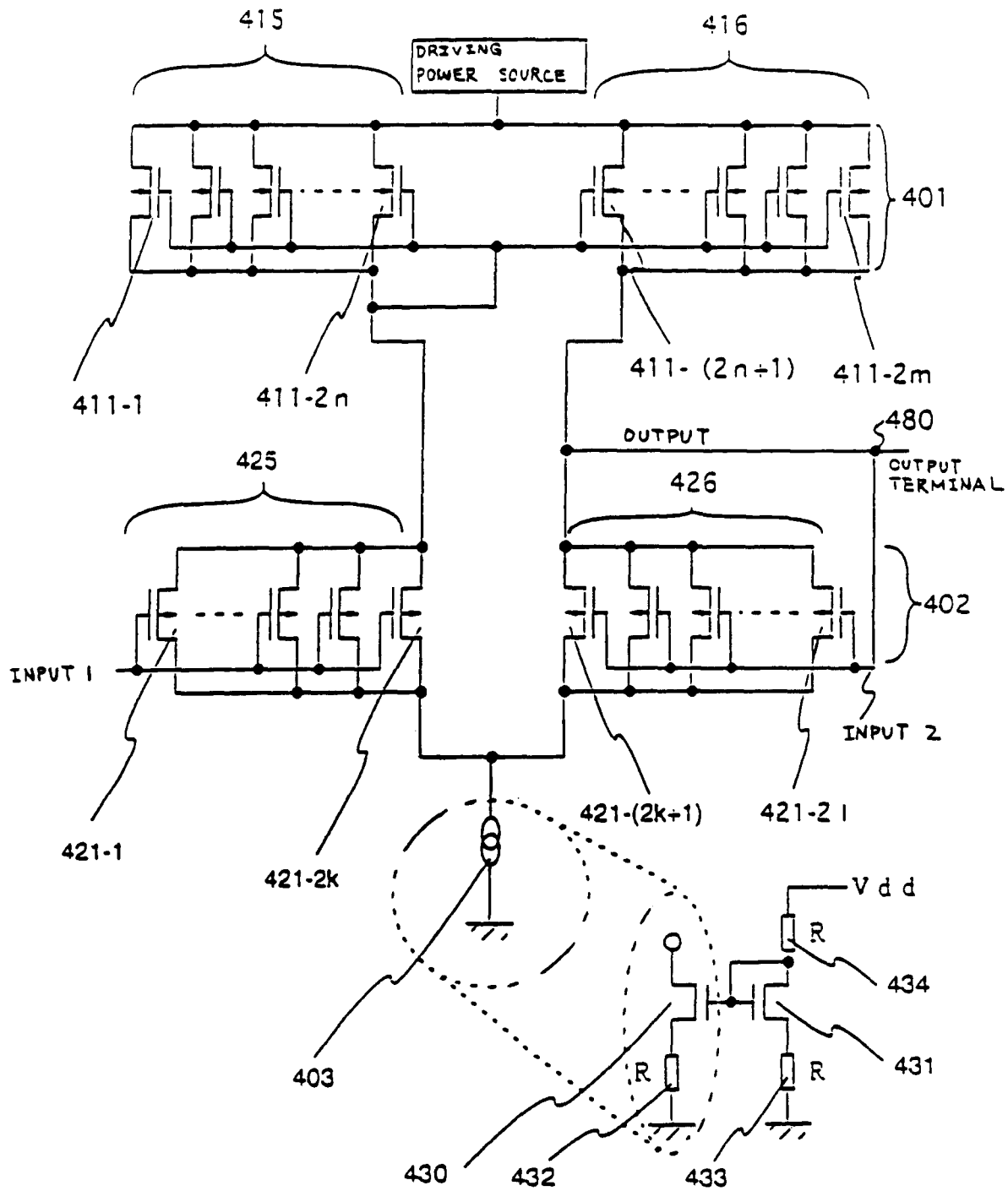
FIG. 4 is a schematic of a circuit according to the present invention.

FIG. 4 shows the present embodiment. FIG. 4 shows an example of an analog buffer having a differential circuit 402 and a current mirror circuit 401 that embody the present invention. In the differential circuit 402 connected to the current mirror circuit 401, a first set of thin film transistors 425 and a second set of thin film transistors 426 face each other. The first set of thin film transistors 425 comprises 2k pieces of thin film transistors 421-1 through 421-2*k*, and the gate, source and drain electrodes of each of the 2k pieces of transistors are connected. There is provided a first input terminal for inputting an input signal to the connected gate electrodes; the connected source or drain electrodes are connected to the current mirror circuit; and the other drain or source electrodes are connected to a constant current power source 403.

The second set of thin film transistors 426 comprises 2l-2k pieces of thin film transistors 422-(2k+1) through 421-2*l*, and the gate, source and drain electrodes of each of the 2l-2k pieces of transistors are connected. There is provided a second input terminal for inputting an input signal to the connected gate electrodes; the connected source or drain electrodes are connected to the current mirror circuit; and the other drain or source electrodes are connected to the constant current power source 403.

As illustrated, the constant current source 403 is formed by combining a transistor 403 and a resistor 432, connecting the source to the ground through the resistor 432 and connecting the drain to the differential circuit 402. The gate of the transistor 430 is connected to the gate of another transistor 431; the source of the transistor 431 is connected to the ground through a resistor 433; and the drain of the same is connected to Vdd through a resistor 434. The two transistors 430 and 432 used for the constant current source 403 are not required to have similar characteristics, it is therefore not necessary to apply the present invention to them.

In order to reduce any difference in characteristics between the first set of thin film transistors 425 and the second set of thin film transistors 426, the first set 425 is formed by 2k pieces of thin film transistors and the second set 426 is formed by 2l-2k pieces of thin film transistors to level off variation that will be significant if there is only one transistor. Such leveling is carried out by forming two transistors in positions that are geometrically point-symmetric about a symmetry center into one set of transistors and selecting other two transistors in positions that are point-symmetric into another set of transistors instead of combining adjoining transistors.

Therefore, both of the first set 425 and second set 426 must have an even number of thin film transistors.

The active regions of the thin film transistors are almost entirely constituted by the channel formation regions, and variation of carriers that flow through the channel formation regions is entirely attributable to variation between the thin film transistors. The connections of the source electrodes and drain electrodes have almost nothing to do with variation of the thin film transistors.

When the transistors are placed in positions which are point-symmetric about the symmetry center, it is important to place the channel formation regions in the point-symmetric positions instead of placing the transistors as a whole in the point-symmetric positions.

Although all of the thin film transistors in the differential circuit 402 are of p-type, the above description equally applies where they are all n-type transistors.

In the current mirror circuit 401, a first set of thin film transistors 415 and a second set of thin film transistors 416 face each other. The first set of thin film transistors 415 comprises 2n pieces of thin film transistors 411-1 through 411-2n, and the gate, source and drain electrodes of each of the 2n pieces of transistors are connected. The connected source or drain electrodes are connected to the differential amplifier circuit, and the other drain or source electrodes are connected to a driving power source.

The second set of thin film transistors 416 comprises 2m-2n pieces of thin film transistors 421-(2n+1) through 421-2m, and the gate, source and drain electrodes of each of the 2m-2n pieces of transistors are connected. The connected source or drain electrodes are connected to the differential amplifier circuit, and the other drain or source electrodes are connected to the driving power source. The gate electrodes of the first sets of thin film transistors 415 thus connected are connected to the gate electrodes of the second set of thin film transistors 416 thus connected. The gate electrodes thus connected are connected to the source or drain electrodes of the first set of thin film transistors 415 which are connected to the differential circuit.

In order to reduce any difference in characteristics between the first set of thin film transistors 415 and the second set of thin film transistors 416, the first set 415 is formed by 2n pieces of thin film transistors and the second set 416 is formed by 2m-2n pieces of thin film transistors to level off variation that will be significant if there is only one transistor. Such leveling is carried out by forming two transistors in positions that are geometrically point-symmetric about a symmetry center into one set of transistors and selecting other two transistors in positions that are point-symmetric into another set of transistors instead of combining adjoining transistors.

Therefore, both of the first set 415 and second set 416 must have an even number of thin film transistors.

The active regions of the thin film transistors are almost entirely constituted by the channel formation regions, and variation of carriers that flow through the channel formation regions is entirely attributable to variation between the thin film transistors. The connections of the source electrodes and drain electrodes have almost nothing to do with variation of the thin film transistors.

When the transistors are placed in positions which are point-symmetric about the symmetry center, it is important to place the channel formation regions in the point-symmetric positions instead of placing the transistors as a whole in the point-symmetric positions.

Although all of the thin film transistors in the current mirror circuit 401 are of n-type, the above description equally applies where they are all p-type transistors.

The second input terminal of the differential circuit 402 and an output terminal between the differential circuit and current mirror circuit are connected at 480, and the connected portion serves as an output terminal from which an output signal is taken out. An analog signal input to the first input terminal is taken out from the output terminal as an output signal with a waveform which has been unchanged, and the present embodiment is thus used as an analog buffer amplifier.

When a liquid crystal display for a liquid crystal projector having a diagonal dimension of 3 inches (76 mm) as shown in FIG. 4 was formed using a manufacturing step utilizing high temperature silicon for forming six liquid crystal displays of 3 inches from one sheet of quartz substrate or synthesized quarts substrate, a circuit located at the periphery of the substrate displayed 64 tones when used for display of 64 tones for which a buffer amplifier is required.

Without the configuration according to the invention, although values on the order of 64 tones can be achieved in some regions such as the center of a substrate if processing conditions are sufficiently examined, it has not been possible to display 64 tones at the periphery of a substrate.

Obviously, it is preferable that the configuration of the present embodiment is applied to the entire region of a substrate instead of applying it to only the periphery of the substrate from the viewpoint of problems associated with fabrication processes that originates in uniformity of the circuit patterns or variation of the pattern depending on its position on the substrate. Especially, the present invention is preferably applied to cases wherein channel formation regions include grain boundaries.

Further, when polysilicon obtained using laser crystallization or when both of polysilicon and amorphous silicon are used, as shown in FIG. 9, the present embodiment may be advantageously used in a position where there is no way to achieve uniformity of thin film polysilicon transistors because of the position of the laser irradiation. It is obvious that the present embodiment may be applied to not only combination of thin film transistors in a position on a substrate defined by the laser irradiating position but also to any position on the entire surface of the substrate.

The present embodiment is advantageous especially for acicular or columnar polycrystalline silicon thin film transistors that have grown in lateral directions according to the method of crystallization utilizing a metal catalyst described in Japanese unexamined patent publication No. H8-335152 of the present applicant. In this case, 128 tones can be obviously displayed on the entire area of the substrate and even 256 tones can be displayed.

A third embodiment of the present invention will now be described. FIGS. 1A and 1B show the present embodiment. FIG. 1A shows an example of a circuit configuration of thin film transistors according to the present invention. The areas enclosed by the dotted line constitute a current mirror circuit 101 and a differential circuit 102. The current mirror circuit is connected to a driving power source, and the differential circuit 102 includes an input 1 and an input 2 for inputting input signals. The differential circuit 102 is connected to a constant current source 103.

When a signal is input to each of the inputs 1 and 2 of the circuit, a difference between them is output from an output as an output signal. When a new output is taken out from a connected portion (not shown) between the output and the input 2, the circuit operates as an analog buffer amplifier which outputs the same signal as the input signal input at the input 1.

Each of the current mirror circuit 101 and differential circuit 102 includes four thin film transistors as constituent parts. The thin film transistors used in the current mirror circuit 101 and differential circuit 102 have opposite polarities. In FIGS. 1A and 1B, n-type thin film transistors are used in the current mirror circuit 101 and p-type thin film transistors are used in the differential circuit 102. The p-type and n-type polarities may be reversed.

This circuit does not operate when they have the same polarity.

N-type thin film transistors (hereinafter referred to as n-TFTs) 111, 112, 113 and 114 are provided in the current mirror circuit 101. A first set of n-TFTs 111 and 112 are paired, and a second set of n-TFTs 113 and 114 are paired. The gate electrodes of the first set of n-TFTs 111 and 112 are connected to each other; the gate electrodes of the second set of n-TFTs 113 and 114 are connected to each other; and the gate electrodes of those sets are connected. The connected portion is connected to the sources or drains of the n-TFTs 111 and 112. The drains or sources of the n-TFTs 111, 112, 113 and 114 which are not connected to the gate electrodes are connected to a driving power source.

The differential circuit 102 includes p-type thin film transistors (hereinafter referred to as p-TFTS) 121, 122, 123 and 124. A first set of p-TFTs 121 and 122 are paired, and a second set of p-TFTs 123 and 124 are paired. The gate electrodes of the first set of p-TFTs 121 and 122 are connected to each other and are connected to a first input signal source, and the gate electrodes of the second set of p-TFTs 123 and 124 are connected to each other and are connected to a second input signal source. The sources and drains of the p-TFTs 121, 122, 123 and 124 are connected to a constant current power source 103.

The sources or drains of the first set of n-TFTs 111 and 112 of the current mirror circuit 101 are connected to the drains or sources of the first set of p-TFTs 121 and 122 of the differential circuit 102, and the sources or drains of the second set of n-TFTs 113 and 114 of the current mirror circuit 101 are connected to the drains or sources of the second set of p-TFTs 123 and 124 of the differential circuit 102. An output signal is taken out from the portion where the second sets of n-TFTs 113 and 114 and p-TFTs 123 and 124 are connected.

In order to reduce such a difference in characteristics between the first set of thin film transistors p-TFTs 121 and 122 and the second set of thin film transistors p-TFTs 123 and 124, each set is formed by two transistors to level off variation that will be significant if there is only one transistor. Such leveling is carried out by forming two transistors in positions that are geometrically point-symmetric about a symmetry center into one set of transistors and selecting other two transistors in positions that are point-symmetric into another set of transistors instead of pairing adjoining transistors.

FIG. 1B shows an example of a horizontal arrangement and connection of four thin film transistors of the differential circuit 102 on the substrate. As illustrated, the p-TFTs 121 and 122 are in diagonal positions and the p-TFTs 123 and 124 are in opposite diagonal positions to be in a crossing relationship with the p-TFTs 121 and 122. Each set of TFTs is in a positional relationship which is point-symmetric about a symmetry center 138, and each thin film transistor has the same basic configuration.

There are semiconductor layer 131, a source electrode 133, source contacts 135, a drain electrode 134, drain contacts 136, and a gate electrode 132. Although not shown in FIG. 1B which is a plan view, a gate insulation film is provided under the gate electrode 132, and the semiconductor 131 is provided under the gate insulation film. There is a channel formation region in the area of the semiconductor layer 131 overlapping with the gate electrode 132.

The p-TFTs 121 and 122 share a common gate electrode 132, and the p-TFTs 123 and 124 share a common gate electrode 137. Although the connections of the sources and drains are not shown, the active regions of the thin film transistors are almost entirely constituted by the channel formation regions and variation of carriers that flow through the channel formation regions is entirely attributable to variation between the thin film transistors. The connections of the source electrodes and drain electrodes have almost nothing to do with variation of the thin film transistors.

Therefore, when transistors are placed in positions which are point-symmetric about the symmetry center 138, it is important to place the channel formation regions in the point-symmetric positions instead of placing the transistors as a whole in the point-symmetric positions.

Although FIGS. 1A and 1B show an example where four each thin film transistors are used in the current mirror circuit 101 and differential circuit 102, the number of the transistors may be increased to reduce variation of characteristics further. Obviously, liquid crystal displays having 64 tones and 256 tones have different requirements for variation, and variation must be smaller for 256 tones.

Although the present embodiment has been described with reference to the differential circuit 102, the description equally applies to the current mirror circuit 101.

When a liquid crystal display for a liquid crystal projector having a diagonal dimension of 3 inches (76 mm) as shown in FIGS. 1A and 1B was formed using a manufacturing step utilizing high temperature silicon for forming six liquid crystal displays of 3 inches from one sheet of quartz substrate or synthesized quarts substrate, a circuit located at the periphery of the substrate displayed 64 tones when used for display of 64 tones for which a buffer amplifier is required.

Without the configuration according to the invention, although values on the order of 64 tones can be achieved in some regions such as the center of a substrate if processing conditions are sufficiently examined, it has not been possible to display 64 tones at the periphery of a substrate.

Obviously, it is preferable that the configuration of the present embodiment is applied to the entire region of a substrate instead of applying it to only the periphery of the substrate from the viewpoint of problems associated with fabrication processes that originates in uniformity of the circuit patterns or variation of the pattern depending on its position on the substrate. Especially, the present invention is preferably applied to cases wherein channel formation regions include grain boundaries.

Further, when polysilicon obtained using laser crystallization or when both of polysilicon and amorphous silicon are used, as shown in FIG. 9, the present embodiment may be advantageously used in a position where there is no way to achieve uniformity of thin film polysilicon transistors because of the position of the laser irradiation. It is obvious that the present embodiment may be applied to not only combination of thin film transistors in a position on a substrate defined by the laser irradiating position but also to any position on the entire surface of the substrate.

The present embodiment is advantageous especially for acicular or columnar polycrystalline silicon thin film transistors that have grown in lateral directions according to the method of crystallization utilizing a metal catalyst described in Japanese unexamined patent publication No. H8-335152 of the present applicant. In this case, 128 tones can be obviously displayed on the entire area of the substrate and even 256 tones can be displayed.

Figure 5A:
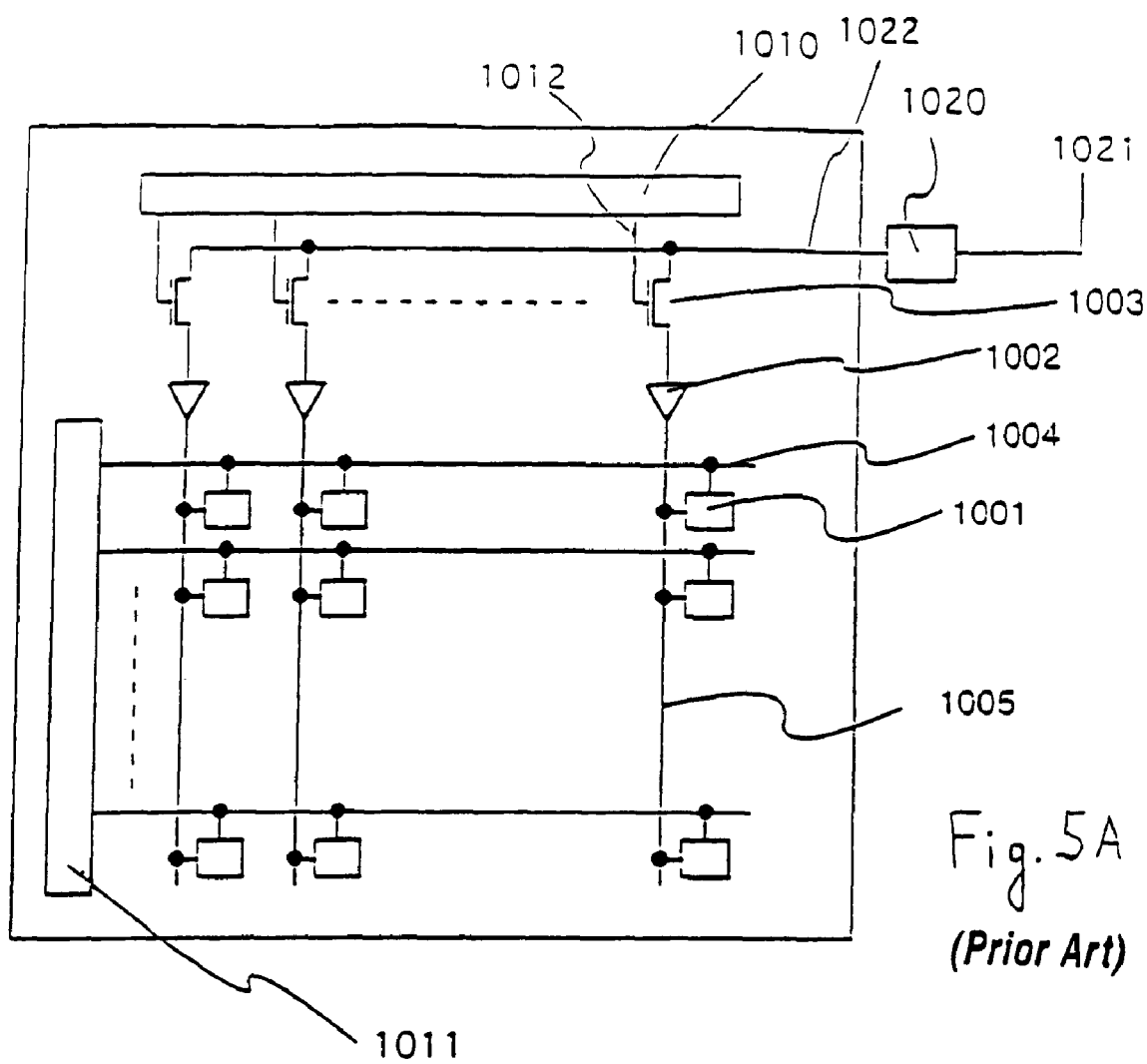
FIGS. 5A and 5B illustrates a liquid crystal display employing the present invention.
Figure 5B:
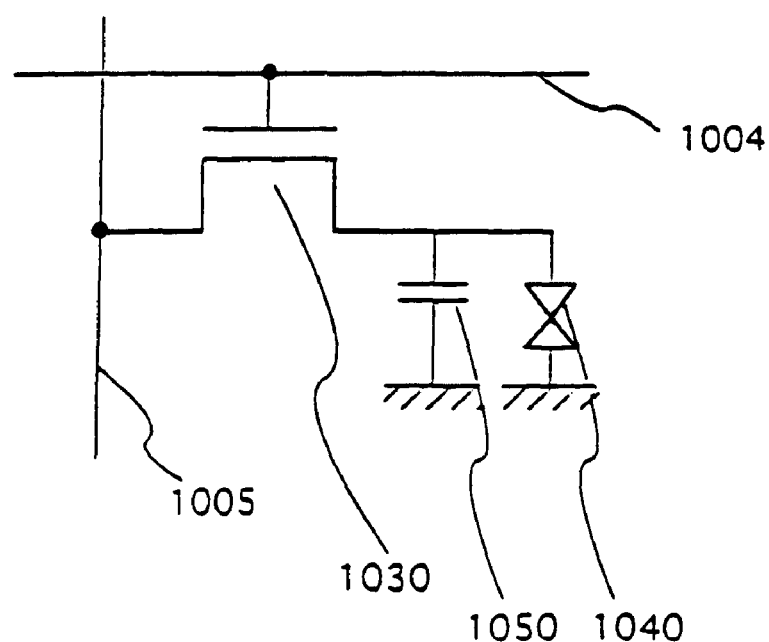
Figure 8:
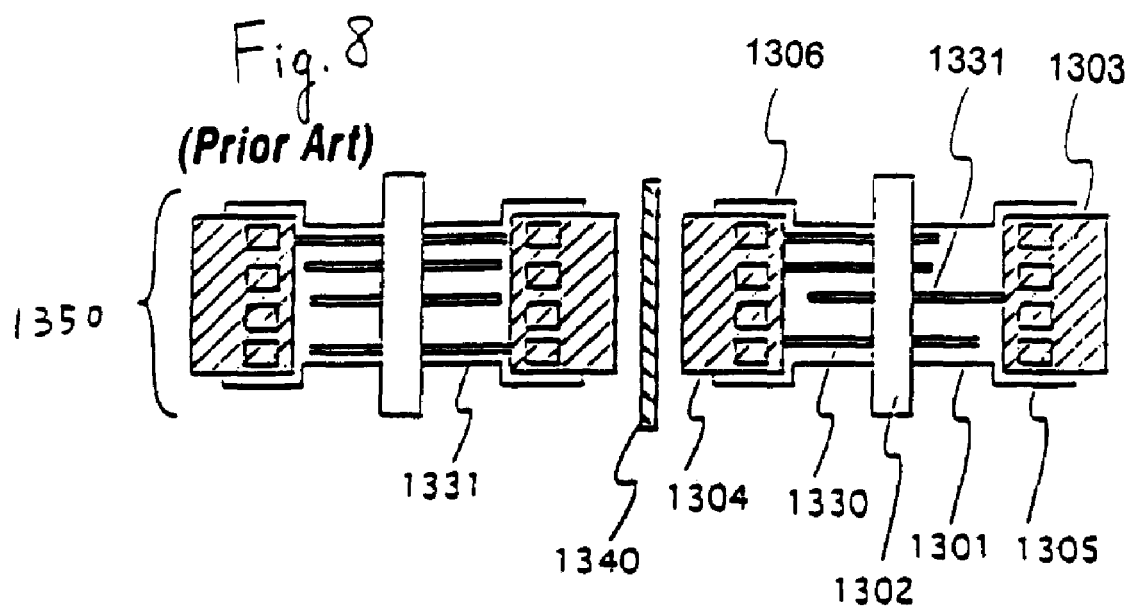
FIG. 8 is a view of elements according to the prior art.

A fourth embodiment of the present invention will now be described. FIGS. 5A and 5B show the present embodiment wherein the present invention is applied to a liquid crystal display. FIG. 5A shows the liquid crystal display. Pixels 1001 are arranged in the form of a grid and are each connected to a data line 1005 and gate line 1004. A signal from a terminal 1021 such as a computer is converted by a D-A converter 1020 from a digital signal to an analog signal which is sent to a video signal line 1022. When the terminal 1021 is a television set which outputs an analog signal by itself, the D-A converter 1004 is not provided. The video signal line 1022 is connected to the source or drain of a switch transistor 1003 connected to each data line, and the switch transistor 1003 is opened when an open signal from a horizontal scan circuit 1010 is supplied to a switch gate line 1012 to supply a video signal to the data line 1005.

The video signal supplied to the data line 1005 is supplied through a buffer amplifier 1002 to the pixel 1004. As this buffer amplifier, a differential amplifier circuit using a differential circuit and a current mirror circuit according to any of the first through third embodiments and a buffer amplifier as an application of the same are used.

The area of a pixel is shown in FIG. 5B. The data line 1005 is connected to the source or drain of the pixel switch transistor, and the source or drain which is not connected to the data line is connected to a liquid crystal 1050 and a storage capacity 1040.

The gate of the pixel transistor is connected to a gate line 1004 which is connected to a vertical scan circuit 1011.

The semiconductor used for this pixel transistor is any of low temperature polysilicon, medium temperature polysilicon, high temperature polysilicon and a mixture of amorphous silicon and low temperature silicon as described above.

In the case of a liquid crystal display utilizing a low temperature polysilicon, medium temperature polysilicon, high temperature polysilicon or a mixture of amorphous silicon and low temperature polysilicon, it can be used as a semiconductor for the buffer amplifier, switch transistor, horizontal scan circuit and vertical scan circuit. A bipolar transistor or the like utilizing single crystal silicon semiconductor is required for a D-A converter which converts a digital signal into an analog signal in a very short period of time.

In the case of a liquid crystal display utilizing a low temperature polysilicon, medium temperature polysilicon, high temperature polysilicon or a mixture of amorphous silicon and low temperature polysilicon, since the pixel switches, buffer amplifier, switch transistors, horizontal scan circuit and vertical scan circuit can be formed on a substrate using polysilicon, it is possible to reduce the surface area of regions of the liquid crystal display other than the display portion.

There is another advantage in that cost reduction can be achieved in an amount corresponding to a reduction in the IC cost because no monolithic IC utilizing a crystalline semiconductor is used.

A fifth embodiment of the present invention will now be described.

According to the present embodiment, the configuration according to any of the first through fourth embodiments is achieved using reverse-staggered thin film transistors. The same advantage can be achieved by replacing the planar thin film transistors in each embodiment with reverse-staggered thin film transistors.

The use of polycrystalline silicon having high heat-resisting properties such as, e.g., silicon doped with a large amount of phosphorus, for the gate electrodes of the reverse-staggered thin film transistors is useful to obtain thin film transistors having high performance.

The present invention makes it possible to easily fabricate a differential circuit and a current mirror circuit formed by two sets of transistors having substantially the same characteristics in a circuit which is a combination of thin film transistors utilizing low temperature polysilicon, high temperature polysilicon and medium temperature polysilicon.

Especially, it is possible to reduce variation of individual transistors attributable to grain boundaries, acicular crystals present in the channel formation regions thereof and to their positions on a substrate by using the geometrical arrangement and method of circuit connection.

Further, it is possible to use the geometrical arrangement and method of circuit connection to reduce variation attributable to overlapping of areas irradiated by a laser which is inevitable during a process employing laser crystallization.

The use of a differential circuit and a current mirror circuit according to the present invention makes it possible to form a preferable differential amplifier circuit. A preferable analog buffer amplifier can be formed by connecting one of two inputs of the differential amplifier circuit to an output terminal.

An analog buffer amplifier according to the present invention exhibits very high reliability against changes in temperature and the like because it includes two groups of thin film transistors combined such that they have the same characteristics.

The use of a differential amplifier circuit and an analog buffer amplifier according to the present invention in a liquid crystal display makes it possible to achieve excellent display of tones. Especially, the present invention is suitable for analog signals.

In each of the aspects of the present invention described in this specification, it is advantageous to selectively use regions of a polysilicon film for forming an active region that include no or substantially no grain boundary so that the active region for forming a thin film transistor will include no grain boundary.

When polysilicon which has been laterally grown in the form of columnar or acicular crystals is used as an active region, a thin film transistor having improved mobility can be obtained by causing the lateral growth in a direction parallel to or substantially parallel to the moving direction of carriers.

Further, an active region of a thin film transistor may be constituted by a region which has substantially no grain boundary and which can be regarded as monocrystalline (referred to as mono-domain region) by temporarily melting grain boundaries in a laterally grown region constituted by a set of a plurality of columnar or acicular crystals using a laser, an intense beam equivalent thereto or the like and by recoupling them later.

Each aspect of the invention described in this specification may be used for either of reflection-type and transmission-type liquid crystal displays and is advantageous not only for liquid crystal displays but also for displays utilizing organic or inorganic EL (electro-luminescence) elements and various other circuits that can be formed using thin film transistors.

The foregoing discussion discloses and described merely exemplary embodiments of the invention. As will be understood by those skilled in the art, the invention may be embodied in other specific forms without departing from the spirit or essential characteristics thereof. Accordingly, the disclosure of the present invention is intended to be illustrative, but not limiting, of the scope of the invention, which is set forth in the appended claims.

What is claimed is:

1. A method for forming a circuit comprising:
   forming a first island and a second island and a third island and a fourth island over a substrate, each of the first island and the second island and the third island and the fourth island comprising a channel region;
   scanning the substrate with a linear laser light in a first direction, the linear laser light having a longitudinal direction perpendicular to the first direction;
   forming a first common electrode comprising a first gate electrode and a second gate electrode, the first gate electrode provided adjacent to the first island with a first gate insulating film therebetween, the second gate electrode provided adjacent to the second island with a second gate insulating film therebetween; and
   forming a second common electrode comprising a third gate electrode and a fourth gate electrode, the third gate electrode provided adjacent to the third island with a third gate insulating film therebetween, the fourth gate electrode provided adjacent to the fourth island with a fourth gate insulating film therebetween,
   wherein the first island and the third island are arranged in a first line along the longitudinal direction,
   wherein the second island and the fourth island are arranged in a second line along the longitudinal direction, and
   wherein the first line is different from the second line.

2. A method for forming a circuit according to claim 1 wherein the first common electrode is crossed with the second common electrode.

3. A method for forming a circuit according to claim 1 wherein the first island and the third island are irradiated with the linear laser light simultaneously.

4. A method for forming a circuit according to claim 1 wherein the second island and the fourth island are irradiated with the linear laser light simultaneously.

5. A method for forming a circuit according to claim 1 wherein the circuit is incorporated into a display device.

6. A method for forming a circuit according to claim 1 wherein the circuit is incorporated into a liquid crystal display device.

7. A method for forming a circuit according to claim 1 wherein the circuit is incorporated into an electro-luminescence display device.

8. A method for forming a circuit comprising:
   forming a first island and a second island and a third island and a fourth island over a substrate, each of the first island and the second island and the third island and the fourth island comprising a channel region;
   scanning the substrate with a linear laser light in a first direction, the linear laser light having a longitudinal direction perpendicular to the first direction;
   forming a first common electrode comprising a first gate electrode and a second gate electrode, the first gate electrode provided adjacent to the first island with a first gate insulating film therebetween, the second gate electrode provided adjacent to the second island with a second gate insulating film therebetween; and
   forming a second common electrode comprising a third gate electrode and a fourth gate electrode, the third gate electrode provided adjacent to the third island with a third gate insulating film therebetween, the fourth gate electrode provided adjacent to the fourth island with a fourth gate insulating film therebetween,
   wherein the first island and the third island are arranged in a first line along the longitudinal direction,
   wherein the second island and the fourth island are arranged in a second line along the longitudinal direction,
   wherein the first line is different from the second line,
   wherein the first island and the second island are arranged to be point-symmetric, and
   wherein the third island and the fourth island are arranged to be point-symmetric.

9. A method for forming a circuit according to claim 8 wherein the first common electrode is crossed with the second common electrode.

10. A method for forming a circuit according to claim 8 wherein the first island and the third island are irradiated with the linear laser light simultaneously.

11. A method for forming a circuit according to claim 8 wherein the second island and the fourth island are irradiated with the linear laser light simultaneously.

12. A method for forming a circuit according to claim 8 wherein the circuit is incorporated into a display device.

13. A method for forming a circuit according to claim 8 wherein the circuit is incorporated into a liquid crystal display device.

14. A method for forming a circuit according to claim 8 wherein the circuit is incorporated into an electro-luminescence display device.

15. A method for forming a circuit comprising:
   forming a first island and a second island and a third island and a fourth island over a substrate, the first island comprising a first channel region and the second island comprising a second channel region and the third island comprising a third channel region and the fourth island comprising a fourth channel region;
   scanning the substrate with a linear laser light in a first direction, the linear laser light having a longitudinal direction perpendicular to the first direction;
   forming a first common electrode comprising a first gate electrode and a second gate electrode, the first gate electrode provided adjacent to the first island with a first gate insulating film therebetween, the second gate electrode provided adjacent to the second island with a second gate insulating film therebetween;

forming a second common electrode comprising a third gate electrode and a fourth gate electrode, the third gate electrode provided adjacent to the third island with a third gate insulating film therebetween, the fourth gate electrode provided adjacent to the fourth island with a fourth gate insulating film therebetween, forming a first source region and a first drain region sandwiching the first channel region;

forming a second source region and a second drain region sandwiching the second channel region;

forming a third source region and a third drain region sandwiching the third channel region; and forming a fourth source region and a fourth drain region sandwiching the fourth channel region, wherein the first island and the third island are arranged in a first line along the longitudinal direction, wherein the second island and the fourth island are arranged in a second line along the longitudinal direction, wherein the first line is different from the second line, wherein the first source region is connected with the second source region, wherein the first drain region is connected with the second drain region, wherein the third source region is connected with the fourth source region, and wherein the third drain region is connected with the fourth drain region.

16. A method for forming a circuit according to claim 15 wherein the first common electrode is crossed with the second common electrode.

17. A method for forming a circuit according to claim 15 wherein the first island and the third island are irradiated with the linear laser light simultaneously.

18. A method for forming a circuit according to claim 15 wherein the second island and the fourth island are irradiated with the linear laser light simultaneously.

19. A method for forming a circuit according to claim 15 wherein the circuit is incorporated into a display device.

20. A method for forming a circuit according to claim 15 wherein the circuit is incorporated into a liquid crystal display device.

21. A method for forming a circuit according to claim 15 wherein the circuit is incorporated into an electro-luminescence display device.

* * * * *